United States Patent [19]

Kim et al.

[11] Patent Number: 5,693,555
[45] Date of Patent: Dec. 2, 1997

[54] METHOD FOR FABRICATING BICMOS DEVICE

[75] Inventors: Kwang-Soo Kim; Cheon-Soo Kim; Kyu-Ha Baek; Bo-Woo Kim, all of Daejeon, Rep. of Korea

[73] Assignee: Electronics and Telecommunications Research Institute, Daejeon, Rep. of Korea

[21] Appl. No.: 670,756

[22] Filed: Jun. 21, 1996

[30] Foreign Application Priority Data

Jun. 24, 1995 [KR] Rep. of Korea ............. 95-17307

[51] Int. Cl.$^6$ ................................. H01L 21/8249
[52] U.S. Cl. ..................... 437/59; 437/79; 437/162
[58] Field of Search ........................... 437/34, 57, 59, 437/79, 162; 148/DIG. 9

[56] References Cited

U.S. PATENT DOCUMENTS

| | | | |
|---|---|---|---|
| 5,015,594 | 5/1991 | Chu et al. | 437/162 |
| 5,348,896 | 9/1994 | Jang et al. | 437/162 |
| 5,407,841 | 4/1995 | Liao et al. | 437/59 |
| 5,439,833 | 8/1995 | Hebert et al. | 437/59 |

OTHER PUBLICATIONS

"Process Integration Technology for sub-30ps ECL BiCMOS using Heavily Boron Doped Epitaxial Contact (HYDEC)" published in 1994 IEEE.

"A Half-micron Super Self-aligned BiCMOS Technology for High Speed Applications" published in 1992 IEEE.

"Double LDD Concave (LDC) Structure for Sub-half Micron MOSFET" published in 1988 IEEE.

*Primary Examiner*—Chandra Chaudhari
*Attorney, Agent, or Firm*—Antonelli, Terry, Stout, & Kraus, LLP

[57] ABSTRACT

A method for fabricating a bipolar complementary metal oxide semiconductor device, includes a first step of forming a three-layered substrate of $p^-/n^+/n^-$ type or $n^-/p^+/p^-$ type and forming p- and n-wells to be adjacent to each other to the bottom of the top layer of the three-layered substrate; a second step of isolating the p- and n-wells from each other and defining a region for a bipolar transistor on one side to separate base/emitter regions from each other; a third step of defining a gate region to form a metal-oxide semiconductor transistor in each of the p- and n-wells and forming collector/emitter regions in the bipolar transistor region; and a fourth step of forming an n-type metal oxide semiconductor transistor, a p-type metal oxide semiconductor transistor and a bipolar transistor on the p-well, n-well and collector/emitter regions, respectively, and forming source/drain and base electrodes through diffusion by using a doped polycrystalline silicon sidewall spacer.

18 Claims, 4 Drawing Sheets

METHOD FOR FABRICATING BICMOS DEVICE

BACKGROUND OF THE INVENTION

The present invention relates to a method for fabricating a bipolar complementary metal oxide semiconductor (BiCMOS) device sufficient for an application specified integrated circuit (ASIC). More particularly, it relates to such a method for fabricating a BiCMOS device in which a sidewall spacer is used to form a source/drain region, and the source/drain region can be reduced to where it goes beyond the limit of photolithographic techniques thereby having the effect of reducing a parasitic capacitance of the device.

Remarkable progress has been made in the manufacture of semiconductor devices using high integration technology. As the size of semiconductor devices decreases, the problem of minimizing the parasitic capacitance becomes an issue. The parasitic capacitance is stray capacitance generated internally or externally to a circuit, contrary to the circuit designer's intention. The parasitic capacitance unavoidably occurs in proportion to the size of a source/drain region.

The following description relates to semiconductor devices recently developed to suppress the increase of the parasitic capacitance.

FIGS. 1A to 1C depict conventional BiCMOS devices. FIG. 1A illustrates a sectional view of a CMOS device with high-speed performance fabricated by NEC of Japan and disclosed in 1994. The CMOS device of FIG. 1A ensures the high speed performance by minimizing a base region. Metal oxide semiconductor (MOS) devices, however, have an existing semiconductor structure, and still have a problem that the area of source/drain electrodes cannot be reduced to where it goes beyond the limit of the presently-available photolithographic techniques.

FIG. 1B shows a MOS device by Toshiba having a channel structure in which a gate is formed in a trenchlike section. This MOS device may reduce the parasitic capacitance significantly, but also has a disadvantage that the area of source/drain electrodes cannot be reduced to where it goes beyond the limit of the presently-available photolithographic techniques.

FIG. 1C illustrates the structure by a BiCMOS device of AT & T in which a source/drain region is formed by using a polysilicon sidewall spacer, and the source/drain area can be reduced to where it goes beyond the limit of the photolithographic techniques. Defining the area of an emitter electrode in this structure depends on the manufacturing steps, and it is impossible to form a bipolar transistor right on the emitter region, which causes an increase in the emitter resistance. The submicron-size structure of semiconductor devices aggravates such a problem to disable the high speed performance of devices.

SUMMARY OF THE INVENTION

Accordingly, it is an objective of the present invention to provide a method for a bipolar complementary metal oxide semiconductor (BiCMOS) device in which it is possible to minimize a parasitic capacitance and to form a bipolar transistor right on an emitter region, and the short channel effect is reduced by increasing an effective channel length.

In order to realize the above objective, a method for fabricating a bipolar complementary metal oxide semiconductor device, includes: a first step of forming a three-layered substrate of $p^-/n^+/n^-$ type or $n^-/p^+/p^-$ type and forming p- and n-wells to be adjacent to each other to the bottom of the top layer of the three-layered substrate; a second step of isolating the p- and n-wells from each other and defining a region for a bipolar transistor on one side to separate base/emitter regions from each other; a third step of defining a gate region to form a metal oxide semiconductor transistor in each of the p- and n-wells and forming collector/emitter regions in the bipolar transistor region; and a fourth step of forming an n-type metal oxide semiconductor transistor, a p-type metal oxide semiconductor transistor and a bipolar transistor on the p-well, n-well and collector/emitter regions, respectively, and forming source/drain and base electrodes through diffusion by using a doped polycrystalline silicon sidewall spacer.

BRIEF DESCRIPTION OF THE ATTACHED DRAWINGS

DETAILED DESCRIPTION OF PREFERRED EMBODIMENT

Hereinafter, a preferred embodiment of the present invention will be described in detail with reference to the accompanying drawings.

FIGS. 2A to 2H depict the steps in the manufacture of a bipolar complementary metal oxide semiconductor (BiCMOS) device in accordance with the present invention.

Figure 1A:
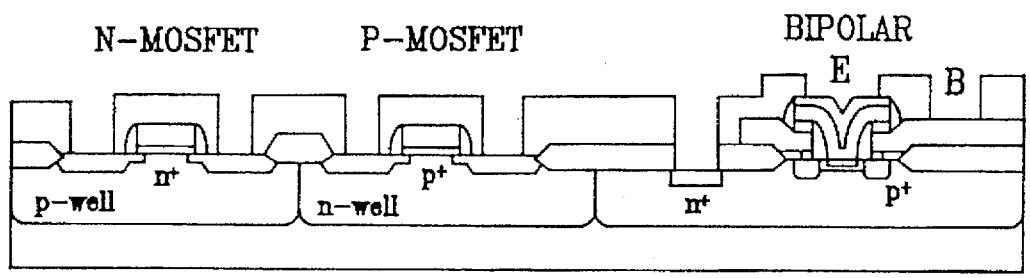
FIGS. 1A to 1C depict the structures of conventional semiconductor devices.
Figure 1B:
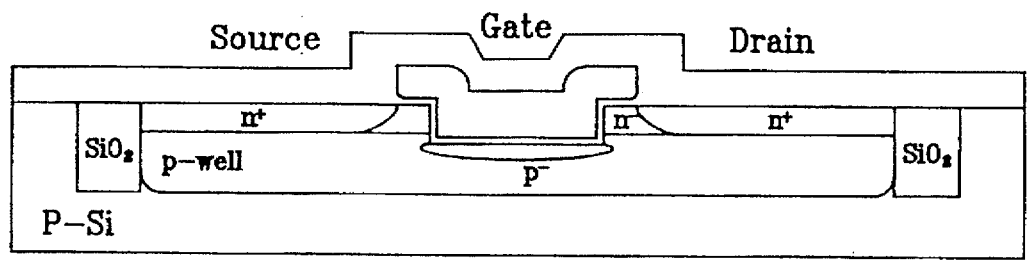
Figure 1C:
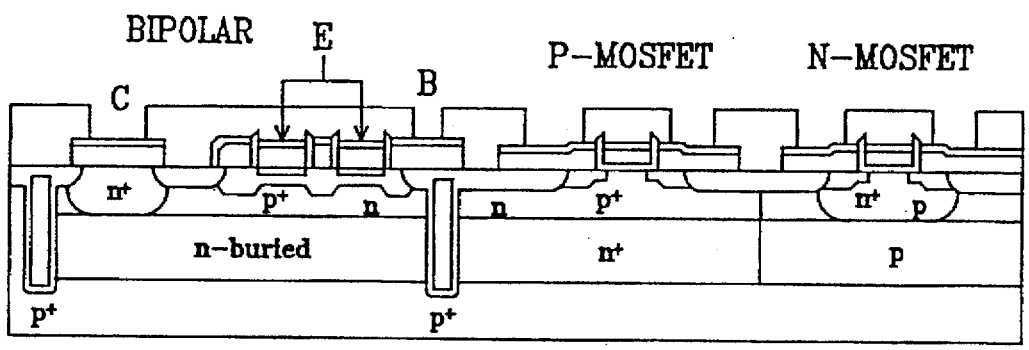
Figure 2A:
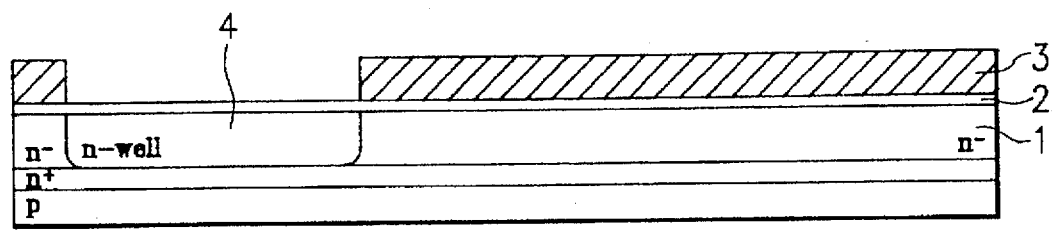
FIGS. 2A to 2H depict the steps in the manufacture of a bipolar complementary metal oxide semiconductor (BiCMOS) device in accordance with the present invention.

Attention is first directed to FIG. 2A. An $SiO_2$ film 2 is formed to a thickness of 30 nm on a $p^-/n^+/n^-$-type silicon substrate 1, and a photoresist film 3 is formed to define an n-well region 4. N-type ions are implanted therein to form the n-well 4.

Figure 2B:
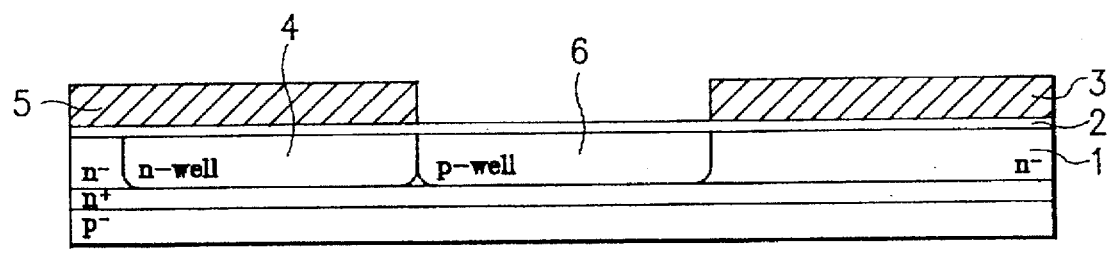

Referring now to FIG. 2B, the photoresist film 3 is removed, and a photoresist film 5 is formed to define a p-well region 6. P-type ions are implanted therein to form the p-well 6.

Figure 2C:
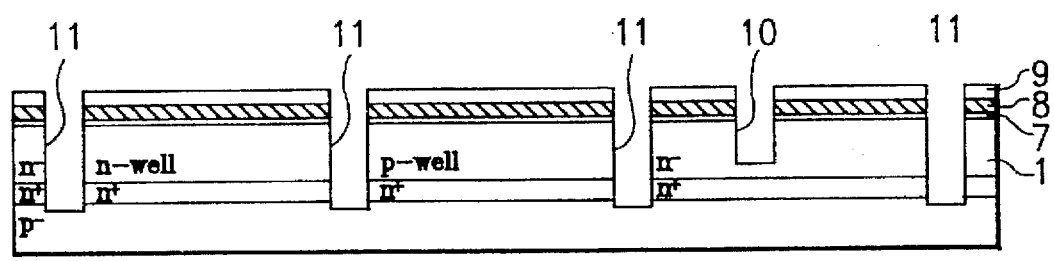

Referring to FIG. 2C, the $SiO_2$ film 2 and photoresist film 5 are removed, and an $SiO_2$ film 7 is formed to a thickness of 30 nm over the substrate having the n-and p-wells. An $Si_3N_4$ film 8 and an $SiO_2$ film 9 are formed in serial order to a thickness of 300 nm and 100 nm, respectively, by low pressure chemical vapor deposition. A trench 10 is formed to a predetermined depth and to a predetermined width to be shallower than the well thereby separating a base region from a collector region. To isolate the adjacent wells from each other, a trench 11 is formed to a predetermined depth of 3 to 5 μm and to a predetermined width on a section between the wells.

Figure 2D:
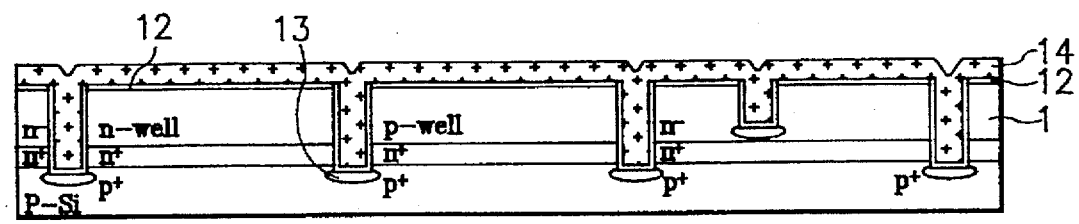

Referring to FIG. 2D, three layers of $SiO_2$ film 7/ $Si_3N_4$ film 8/ $SiO_2$ film 9 are removed, and a sacrificial oxide film 12 is formed all over the substrate. Boron ions are implanted into the bottom of the trench to form a p+ diffusion layer 13. An undoped polysilicon film 14 is formed all over the substrate to fill up the trenches 10 and 11.

Figure 2E:
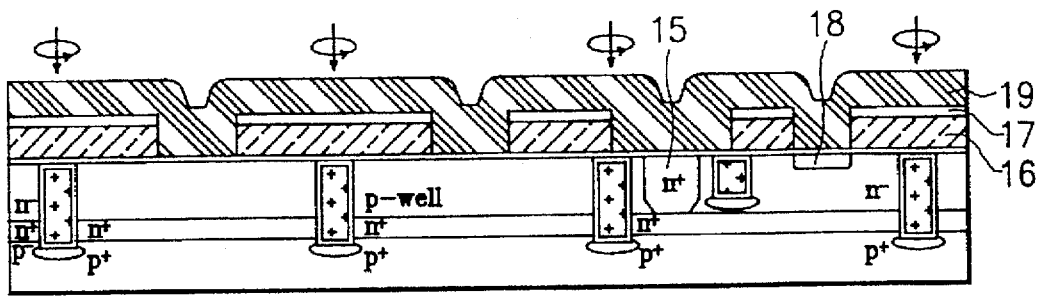

Referring now to FIG. 2E, only the polysilicon film 14 formed on the silicon substrate is etched away either by dry etching or by chemical mechanical polishing to leave polysilicon just in the trenches 10 and 11. A thermal oxide film (not shown) is formed to a thickness of 50 nm on the substrate. On the above thermal oxide film, a polysilicon film 16 for source/drain and base electrodes and an SiO$_2$ film 17 are serially deposited to a thickness of 300 nm and 100 nm, respectively. Subsequently, gate and emitter/collector regions are defined, and n$^+$ and p$^-$ ions are implanted to form collector and base regions 15 and 18. An Si$_3$N$_4$ film 19 is then formed thereon.

Figure 2F:
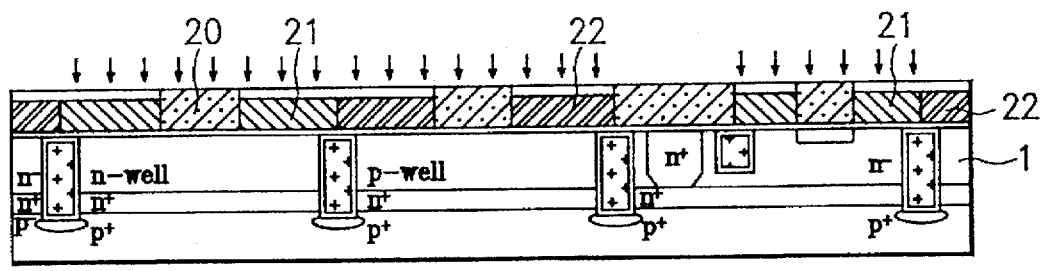

As shown in FIG. 2F, the chemical mechanical polishing process is carried out to leave the Si$_3$N$_4$ film 19 just on the gate and emitter/collector regions. An NMOS region 22 is implanted with N$^+$-type ions and a PMOS region 21 is implanted with P$^+$-type ions.

Figure 2G:
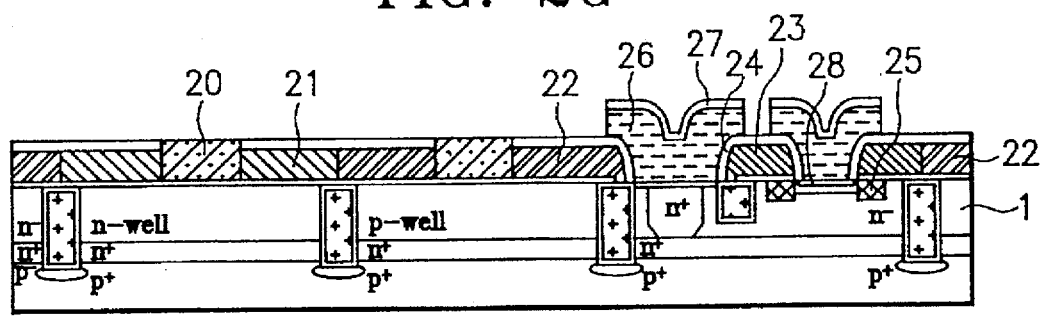

Referring to FIG. 2G, the Si$_3$N$_4$ film 19 formed on the emitter/collector regions is wet-etched and the oxide film is wet-etched by buffered HF solutions to cause an undercut. A thin polysilicon film is then deposited to a thickness of 30 to 100 nm, and B ions are implanted therein to form the extrinsic base region 25.

The polysilicon film is dry-etched to form a polysilicon sidewall spacer 23. This sidewall spacer is used as the diffusion source of the extrinsic base region 25. After that, an oxide film is deposited to a thickness of 100 nm to 200 nm, and is then dry-etched to form a sidewall spacer 24 of the oxide film to isolate base and emitter/collector electrodes from each other. A polysilicon film 26 is formed to a thickness of 300 nm to form emitter/collector electrodes, and As ion implantation is carried out thereon. A protective oxide film 27 is formed to a thickness of 100 nm. Emitter/collector regions are defined and thermally treated so that dopant atoms incorporated in the polysilicon film are diffused throughout the silicon substrate. Accordingly, emitter and extrinsic base electrodes 28 and 25 are formed to complete the formation of a BiCMOS device.

Figure 2H:
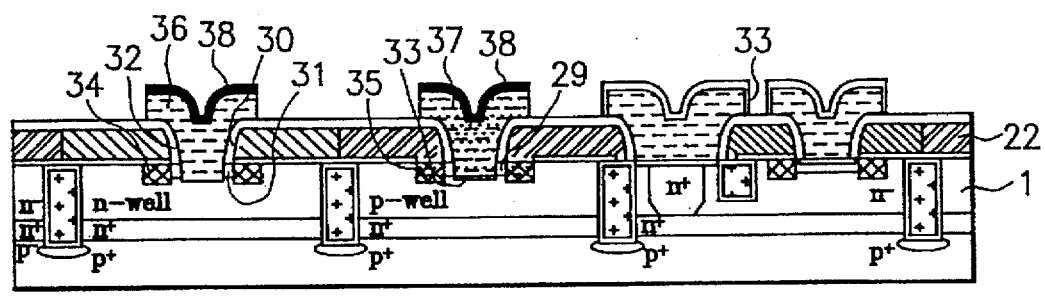
Figure 3:
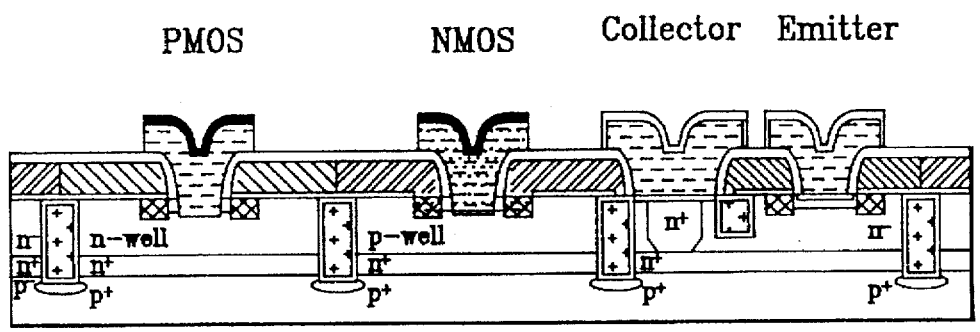
FIG. 3 is a sectional view showing the finalized structure of a BiCMOS device in accordance with the present invention.
Figure 4:
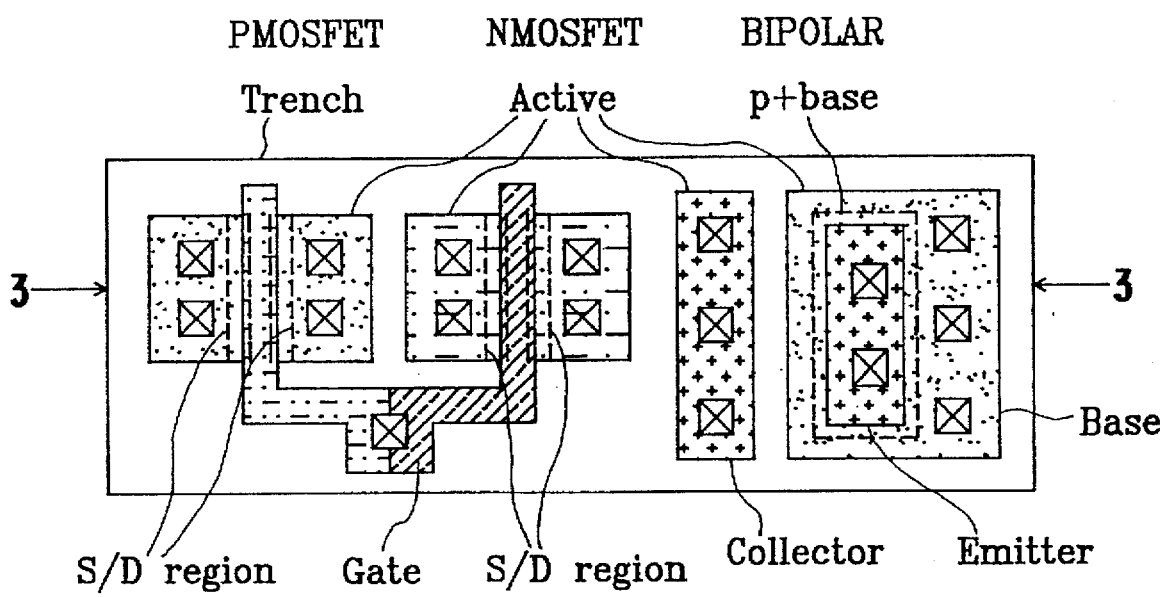
FIG. 4 is a layout of a BiCMOS device in accordance with the present invention.

As the next step, as shown in FIG. 2H, the Si$_3$N$_4$ films on each gate electrode of n-type metal oxide semiconductor (NMOS) region and p-type metal oxide semiconductor (PMOS) region are etched away through wet etching. Subsequently, n$^-$ ions are implanted into regions 29 of the NMOS device where source/drain electrodes are formed, and p$^-$ ions are implanted into regions 30 of the PMOS device where source/drain electrodes are formed for the formation of a lightly doped drain (LDD) structure. In order to facilitate the formation of source/drain electrodes, the oxide film is etched away through wet etching by using buffered HF solutions to cause an undercut.

A thin polysilicon film is formed to a thickness of 30 nm to 100 nm, and As ions and BF$_2$ ions are respectively implanted into the NMOS and PMOS regions to form source/drain electrodes. The polysilicon film is then etched away by dry etching to form a polysilicon sidewall spacer. Subsequently, an oxide film is formed to a thickness of 100 nm to 200 nm and etched away through dry etching to form an oxide sidewall spacer 32 in such a manner that gate and source/drain electrodes are separated from each other.

The silicon substrate is etched by 100 nm to 200 nm to form a channel with a hollow surface. P-type ions and n-type ions are implanted into the NMOS region and PMOS region, respectively, to control a threshold voltage and to preclude a punch-through.

A gate oxide film is grown to a thickness of 6 nm to 10 nm at 850° C., with this thermal process some drain of NMOS 35 and PMOS 36 are formed, and polysilicon is deposited to a thickness of 200 nm to 300 nm. N$^+$ ions and p$^+$ ions are implanted into the NMOS and PMOS regions, respectively, and silicide material for reducing the polisilicon resistance is deposited with a thickness of 100 nm. A gate electrode is defined, and oxide film for passivation is deposited, and then, a fabrication of BiCMOS transistor is completed after contact formation and materialization of a CMOS transistor.

In the inventive technique, the fabrication of a bipolar transistor may follow the formation of a CMOS transistor according to its field of application.

In conclusion, the present invention may provide a BiCMOS device that can ensure higher speed performance, higher integrity and lower power consumption compared to a conventional BiCMOS device.

The preferred embodiments of the present invention are given by way of example, and the invention recited in the attached claims is not limited to the illustrative embodiments. Those of ordinary skill in the art will recognize that routine design changes may be made to the exemplary embodiments without departing from the scope of the claims.

What is claimed is:

1. A method for fabricating a bipolar complementary metal oxide semiconductor device, said method comprising the following steps of:

a first step of forming a p$^-$/n$^+$/n$^-$ type three-layered substrate and forming p- and n-wells to be adjacent to each other to the bottom of the top layer of the three-layered substrate;

a second step of isolating said p- and n-wells from each other and defining a region for a bipolar transistor on one side thereof to separate base/emitter regions from each other;

a third step of defining a gate region to form a metal-oxide semiconductor transistor in each of said p- and n-wells and forming collector/emitter regions in said bipolar transistor region; and a fourth step of forming an n-type metal oxide semiconductor transistor, a p-type metal oxide semiconductor transistor and a bipolar transistor on said p-well, n-well and collector/emitter regions, respectively, and forming source/drain and base electrodes through diffusion by using a doped polycrystalline silicon sidewall spacer.

2. A method according to claim 1, wherein said second step comprises the sub-steps of:

forming and growing a first SiO$_2$ film, a Si$_3$N$_4$ film and a second SiO$_2$ film on said p- and n-wells, in serial order, to a predetermined thickness;

forming a first trench whose depth is shallower than that of each of p- and n-wells in a region adjacent to said p- and n-wells to separate base and collector electrodes of a bipolar transistor from each other;

forming a second trench between said wells to a depth reaching the middle of the lowest layer of said substrate to separate said p-well and n-well from each other;

removing said first SiO$_2$ film, Si$_3$N$_4$ film and second SiO$_2$ film formed in serial order and growing a sacrificial oxide film all over said substrate;

implanting p$^+$ ions into the bottom of said second trench of said p$^-$/n$^+$/n$^-$-type substrate; and forming an undoped polysilicon film all over said substrate to fill up said first and second trenches.

3. A method according to claim 1, wherein said third step comprises the sub-steps of:

removing only said polysilicon film deposited on the substrate to fill said first and second trenches with polysilicon;

forming and growing a thermal oxide film, a polysilicon film for source/drain and base electrodes, and an $SiO_2$ film;

defining gate and emitter/collector regions of said substrate and forming collector and base regions thereof by implanting $n^+$ and $p^-$ ions into collector and base regions, respectively; and forming a $Si_3N_4$ film all over said substrate and selectively removing said $Si_3N_4$ film to leave said $Si_3N_4$ film just on said gate and emitter/collector regions; and implanting $n^+$ ions and $p^+$ ions into an n-type metal oxide semiconductor region, a p-type metal oxide semiconductor region.

4. A method according to claim 3, wherein said step of removing only said polysilicon film formed on said substrate or said step of selectively removing said $Si_3N_4$ film is carried out by means of a chemical mechanical polishing process.

5. A method according to claim 1, wherein said fourth step comprises the sub-steps of:

forming a bipolar transistor on the third layer of said substrate; and forming an n-type metal oxide semiconductor transistor and a p-type metal oxide semiconductor transistor on said p-well and n-well, respectively.

6. A method according to claim 1, wherein said fourth step further comprises the sub-steps of:

forming an n-type metal oxide semiconductor transistor and a p-type metal oxide semiconductor transistor on said p-well and n-well, respectively; and forming a bipolar transistor on the third layer of said substrate.

7. A method according to claim 1, wherein said fourth step of forming a bipolar transistor comprises the sub-steps of:

etching away said $Si_3N_4$ film left just on said emitter/collector regions through wet etching and then etching away said oxide film through wet etching by means of buffered HF solutions to cause an undercut in order to facilitate the formation of an extrinsic base region;

forming a polysilicon thin film to a predetermined thickness and doping said polysilicon film with $BF_2$ ions to form an extrinsic base region;

etching away said polysilicon film through dry etching to minimize a parasitic capacitance of the base electrode and forming a polysilicon sidewall spacer;

forming an oxide film to a predetermined thickness and dry-etching said oxide film to form a sidewall spacer of the oxide film thereby separating base and emitter/collector electrodes from each other;

forming a polysilicon film to a predetermined thickness for the formation of emitter/collector electrodes and doping said polysilicon film with As ions;

forming a protective oxide film to a predetermined thickness; and defining emitter/collector electrodes and carrying out heat treatment thereon so that dopant atoms incorporated in said polysilicon film are diffused throughout the silicon substrate and forming emitter and extrinsic base electrodes to complete the formation of a bipolar transistor.

8. A method according to claim 1, wherein said fourth step of forming metal oxide semiconductor transistors comprises the sub-steps of:

etching away through wet etching the $Si_3N_4$ film in each gate electrode of n-type and p-type metal oxide semiconductor regions, and implanting $n^-$ ions and $p^-$ ions into the respective portions of the n-type and p-type metal oxide semiconductor regions where source/drain electrodes will be formed so as to form a lightly-doped drain structure;

etching away the oxide film through wet-etching by using buffered HF solutions to cause an undercut so as to facilitate the formation of source/drain regions;

forming a polysilicon film to a predetermined thickness, and doping the n-type and p-type metal oxide semiconductor regions with As ions and BF2 ions, respectively, to form $p^+$- and $n^+$- source/drain electrodes simultaneously;

etching away said thin polysilicon film through dry-etching to form a polysilicon sidewall spacer thereby significantly reducing the area of source/drain electrodes and the overlapped portions between gate and source/drain electrodes as well;

forming an oxide film to a predetermined thickness and etching away said oxide film through dry etching to form a sidewall spacer of the oxide film thereby separating gate and source/drain electrodes from each other;

etching away said silicon substrate by a predetermined depth for securing large driving current characteristics to form a channel with a hollow surface;

implanting p-type ions and n-type ions into the n-type and p-type metal oxide semiconductor regions, respectively, to control a threshold voltage and to preclude a punch-through;

growing a gate oxide film to a predetermined thickness at a predetermined temperature;

forming a polysilicon film to a predetermined thickness; and implanting $n^+$-type ions and $p^+$-type ions into the n-type and p-type metal oxide semiconductor regions, respectively, to define a gate electrode thereby completing the formation of NMOS and PMOS transistors.

9. A method according to claim 8, wherein said step of forming a channel with a hollow surface is carried out by etching the silicon substrate by 100 nm to 200 nm.

10. A method for fabricating a bipolar complementary metal oxide semiconductor device, said method comprising the following steps of:

a first step of forming an $n^-/p^+/p^-$ type three-layered substrate and forming p- and n-wells to be adjacent to each other to the bottom of the top layer of the three-layered substrate;

a second step of isolating said p- and n-wells from each other and defining a region for a bipolar transistor on one side thereof to separate base/emitter regions from each other;

a third step of defining a gate region to form a metal-oxide semiconductor transistor in each of said p- and n-wells and forming collector/emitter regions in said bipolar transistor region; and a fourth step of forming an n-type metal oxide semiconductor transistor, a p-type metal oxide semiconductor transistor and a bipolar transistor on said p-well, n-well and collector/emitter regions, respectively, and forming source/drain and base electrodes through diffusion by using a doped polycrystalline silicon sidewall spacer.

11. A method according to claim 10, wherein said second step comprises the sub-steps of:

forming and growing a first $SiO_2$ film, a $Si_3N_4$ film and a second $SiO_2$ film on said p- and n-wells, in serial order, to a predetermined thickness;

forming a first trench whose depth is shallower than that of each of p- and n-wells in a region adjacent to said p- and n-wells to separate base and collector electrodes of a bipolar transistor from each other;

forming a second trench between said wells to a depth reaching the middle of the lowest layer of said substrate to separate said p-well and n-well from each other;

removing said first $SiO_2$ film, $Si_3N_4$ film and second $SiO_2$ film formed in serial order and growing a sacrificial oxide film all over said substrate;

implanting $n^+$ ions into the bottom of said second trench of said $n^-/p^+/p^-$-type substrate; and forming an undoped polysilicon film all over the substrate to fill up said first and second trenches.

12. A method according to claim 10, wherein said third step comprises the sub-steps of:

removing only said polysilicon film deposited on the substrate to fill said first and second trenches with polysilicon;

forming and growing a thermal oxide film, a polysilicon film for source/drain and base electrodes, and an $SiO_2$ film;

defining gate and emitter/collector regions of said substrate and forming collector and base regions thereof by implanting $p^+$ and $n^-$ ions into collector and base regions, respectively; and forming a $Si_3N_4$ film all over said substrate and selectively removing said $Si_3N_4$ film to leave said $Si_3N_4$ film just on said gate and emitter/collector regions; and implanting $n^+$ ions and $p^+$ ions into an n-type metal oxide semiconductor region, a p-type metal oxide semiconductor region.

13. A method according to claim 12, wherein said step of removing only said polysilicon film formed on said substrate or said step of selectively removing said $Si_3N_4$ film is carried out by means of a chemical mechanical polishing process.

14. A method according to claim 10, wherein said fourth step comprises the sub-steps of:

forming a bipolar transistor on the third layer of said substrate; and forming an n-type metal oxide semiconductor transistor and a p-type metal oxide semiconductor transistor on said p-well and n-well, respectively.

15. A method according to claim 10, wherein said fourth step further comprises the sub-steps of:

forming an n-type metal oxide semiconductor transistor and a p-type metal oxide semiconductor transistor on said p-well and n-well, respectively; and forming a bipolar transistor on the third layer of said substrate.

16. A method according to claim 10, wherein said fourth step of forming a bipolar transistor comprises the sub-steps of:

etching away said $Si_3N_4$ film left just on said emitter/collector regions through wet etching and then etching away said oxide film through wet etching by means of buffered HF solutions to cause an undercut in order to facilitate the formation of an extrinsic base region;

forming a polysilicon thin film to a predetermined thickness and doping said polysilicon film with $BF_2$ ions to form an extrinsic base region;

etching away said polysilicon film through dry etching to minimize a parasitic capacitance of the base electrode and forming a polysilicon sidewall spacer;

forming an oxide film to a predetermined thickness and dry-etching said oxide film to form a sidewall spacer of the oxide film thereby separating base and emitter/collector electrodes from each other;

forming a polysilicon film to a predetermined thickness for the formation of emitter/collector electrodes and doping said polysilicon film with As ions;

forming a protective oxide film to a predetermined thickness; and defining emitter/collector electrodes and carrying out heat treatment thereon so that dopant atoms incorporated in said polysilicon film are diffused throughout the silicon substrate and forming emitter and extrinsic base electrodes to complete the formation of a bipolar transistor.

17. A method according to claim 10, wherein said fourth step of forming metal oxide semiconductor transistors comprises the sub-steps of:

etching away through wet etching the $Si_3N_4$ film in each gate electrode of n-type an p-type metal oxide semiconductor regions, and implanting $n^-$ ions and $p^-$ ions into the respective portions of the n-type and p-type metal oxide semiconductor regions where source/drain electrodes will be formed so as to form a lightly-doped drain structure;

etching away the oxide film through wet-etching by using buffered HF solutions to cause an undercut so as to facilitate the formation of source/drain regions;

forming a polysilicon film to a predetermined thickness, and doping the n-type and p-type metal oxide semiconductor regions with As ions and BF2 ions, respectively, to form $p^+$- and $n^+$- source/drain electrodes simultaneously;

etching away said thin polysilicon film through dry-etching to form a polysilicon sidewall spacer thereby significantly reducing the area of source/drain electrodes and the overlapped portions between gate and source/drain electrodes as well;

forming an oxide film to a predetermined thickness and etching away said oxide film through dry etching to form a sidewall spacer of the oxide film thereby separating gate and source/drain electrodes from each other;

etching away said silicon substrate by a predetermined depth for securing large driving current characteristics to form a channel with a hollow surface;

implanting p-type ions and n-type ions into the n-type and p-type metal oxide semiconductor regions, respectively, to control a threshold voltage and to preclude a punch-through;

growing a gate oxide film to a predetermined thickness at a predetermined temperature;

forming a polysilicon film to a predetermined thickness; and implanting $n^+$-type ions and $p^+$-type ions into the n-type and p-type metal oxide semiconductor regions, respectively, to define a gate electrode thereby completing the formation of NMOS and PMOS transistors.

18. A method according to claim 17, wherein said step of forming a channel with a hollow surface is carried by etching the silicon substrate by 100 nm to 200 nm.

* * * * *